(12) United States Patent
Murakami (10) Patent No.: US 10,103,316 B2
(45) Date of Patent: Oct. 16, 2018

(54) PIEZOELECTRIC FILM, PIEZOELECTRIC ELEMENT INCLUDING THE SAME, AND LIQUID DISCHARGE APPARATUS

(71) Applicant: FUJIFILM Corporation, Tokyo (JP)

(72) Inventor: Naoki Murakami, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/600,395

(22) Filed: May 19, 2017

(65) Prior Publication Data

US 2017/0256700 A1 Sep. 7, 2017

Related U.S. Application Data

(63) Continuation of application No. PCT/JP2015/005839, filed on Nov. 24, 2015.

(30) Foreign Application Priority Data

Nov. 28, 2014 (JP) ................................. 2014-241095

(51) Int. Cl.
*H01L 41/316* (2013.01)
*H01L 41/187* (2006.01)
(Continued)

(52) U.S. Cl.
CPC ............ *H01L 41/316* (2013.01); *B41J 2/045* (2013.01); *B41J 2/14233* (2013.01);
(Continued)

(58) Field of Classification Search
CPC ..... H01L 41/316; H01L 41/09; H01L 41/187; H01L 41/0805; B41J 2/14233; B41J 2/045; B41J 2202/03; C04B 35/493; C23C 14/08
See application file for complete search history.

(56) References Cited

U.S. PATENT DOCUMENTS

2009/0230346 A1* 9/2009 Hamada ................ C04B 35/493
 252/62.9 PZ
2009/0295876 A1* 12/2009 Kobayashi ............. B41J 2/1646
 347/71
2015/0349240 A1* 12/2015 Mizukami ........... H01L 41/1876
 347/70

FOREIGN PATENT DOCUMENTS

JP 2003-063860 A 3/2003
JP 3791614 B2 6/2006
(Continued)

OTHER PUBLICATIONS

International Search Report issued in PCT/JP2015/005839; dated Mar. 8, 2016.
(Continued)

*Primary Examiner* — Henok Legesse
(74) *Attorney, Agent, or Firm* — Studebaker & Brackett PC

(57) ABSTRACT

Provided is a piezoelectric film formed by a vapor phase growth method, the piezoelectric film containing:
a perovskite oxide in which a perovskite oxide represented by the following formula P is doped with Si in an amount of from 0.2 mol % to less than 0.5 mol %, wherein a ratio of a peak intensity of a pyrochlore phase to a sum of peak intensities in respective plane orientations of (100), (001), (110), (101) and (111) of a perovskite phase measured by an X-ray diffraction method is 0.25 or less:

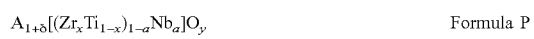

Formula P wherein, in formula P, A is an A-site element primarily containing Pb; Zr, Ti, and Nb are B-site elements; x is more than 0 but less than 1; a is 0.1 or more but less than 0.3.

7 Claims, 5 Drawing Sheets

(51) Int. Cl.
*H01L 41/09* (2006.01)
*C04B 35/493* (2006.01)
*H01L 41/08* (2006.01)
*B41J 2/045* (2006.01)
*B41J 2/14* (2006.01)
*C23C 14/08* (2006.01)

(52) U.S. Cl.
CPC ........ *C04B 35/493* (2013.01); *H01L 41/0805* (2013.01); *H01L 41/09* (2013.01); *H01L 41/187* (2013.01); *B41J 2202/03* (2013.01); *C23C 14/08* (2013.01)

(56) References Cited

FOREIGN PATENT DOCUMENTS

| | | |
|---|---|---|
| JP | 2009-221037 A | 10/2009 |
| JP | 2012-099636 A | 5/2012 |
| JP | 5367242 B2 | 12/2013 |

OTHER PUBLICATIONS

Written Opinion issued in PCT/JP2015/005839; dated Mar. 8, 2016.

Jungho Ryu et al.; "Effect of Heating Rate on the Sintering Behavior and the Piezoelectric Properties of Lead Zirconate Titanate Ceramics"; Journal of the American Ceramic Society; Apr. 2001; pp. 902-904; vol. 84, No. 4; The American Ceramic Society; USA.

L. Bellaiche et al.; "Intrinsic Piezoelectric Response in Perovskite Alloys: PMN-PT versus PZT"; Physical Review Letters; Aug. 16, 1999; pp. 1347-1350; vol. 83, No. 7; The American Physical Society; USA.

An Office Action issued by the Japanese Patent Office dated Aug. 29, 2017, which corresponds to Japanese Patent Application No. 2014-241095 and is related to U.S. Appl. No. 15/600,395; with English translation.

\* cited by examiner

PIEZOELECTRIC FILM, PIEZOELECTRIC ELEMENT INCLUDING THE SAME, AND LIQUID DISCHARGE APPARATUS

CROSS-REFERENCE TO RELATED APPLICATIONS

This application is a continuation application of International Application No. PCT/JP2015/005839, filed Nov. 24, 2015, which is incorporated herein by reference. Further, this application claims priority from Japanese Patent Application No. 2014-241095, filed Nov. 28, 2014, which is incorporated herein by reference.

BACKGROUND OF THE INVENTION

1. Field of the Invention

The present invention relates to a lead zirconate titanate-based piezoelectric film, a piezoelectric element using the piezoelectric film, and a liquid discharge apparatus.

2. Description of the Related Art

An actuator including an ink jet recording head is provided with a piezoelectric body having a piezoelectric property that expands and contracts with variation in applied electric field intensity, and a piezoelectric element provided with an electrode that applies an electric field to the piezoelectric body.

In recent years, in order to meet the demand for miniaturization of an apparatus, miniaturization of an actuator in cooperation with a semiconductor process technology such as a microelectromechanical systems (MEMS) technology has proceeded. In the semiconductor process technology, high-precision processing using film formation or photolithography becomes possible. Therefore, there has been actively conducted research on thinning of a piezoelectric body in an actuator.

As a piezoelectric material having high piezoelectric properties, a lead zirconate titanate (PZT)-based perovskite oxide has been widely used due to its performance. It is known that when a PZT-based perovskite oxide piezoelectric film has a morphotropic phase boundary (MPB) composition in which Zr:Ti is near 52:48, the piezoelectric constant and the electromechanical coupling coefficient thereof become maximum, which is appropriate for actuator applications.

In JP2012-99636A, it is described that in a piezoelectric element provided with a piezoelectric thin film having a laminate of a lead titanate layer and a lead zirconate layer, which have columnar structures, the compositions of lead titanate and lead zirconate in the piezoelectric thin film are caused to be MPB compositions, thereby improving piezoelectric properties.

On the other hand, as a technique for improving piezoelectric properties using a method other than that for the formation of the MPB compositions, a PZT-based piezoelectric film is doped with various donor ions having higher valences than those of substituted ions. Since the ionic valence of Zr and Ti in B-site is 4, as donor ions that substitute for B-site elements, B-site elements having an ionic valence of 5 or higher, such as V, Nb, Ta, Sb, Mo, and W have been used.

However, when attempting to increase the amount of B-site elements to be substituted, the crystallization temperature of the perovskite oxide is increased, and thus it is difficult to increase the doping amount of the donor ions. In J. Am. Ceram. Soc, 84 (2001) 902 and Phys. Rev. Let, 83 (1999) 1347, it is described that in a case of Nb, the doping amount for B-site is about 2.4 mol % to 20 mol %, and when a large amount of Nb is doped, the crystallization temperature rises to 800° C. or higher.

In JP3791614B, it is described that in order to dope a PZT-based ferroelectric film with Nb as B-site ions at a high concentration, 0.5 mol % or more of Si is added. Si is a sintering aid for obtaining a thermal equilibrium state by accelerating sintering in a thermal equilibrium process by a sol-gel method, and is necessary for suppressing an increase in crystallization temperature due to the Nb doping. However, when the sintering aid is added, piezoelectric properties deteriorate, and it is thought that the effect of the addition of donor ions cannot be sufficiently exhibited. Furthermore, as the amount of Si increases, cracks are likely to occur due to the relationship with stress. Therefore, only a thin film having a film thickness of 1 μm or less can be formed, and it is difficult to achieve high properties.

On the other hand, regarding the formation of a donor ion-doped perovskite oxide film according to a vapor phase growth method, a sintered body target, of which the sintered density is increased by adding Si as a sintering aid to the target in an amount of from 0.1 mol % to less than 5 mol % during the production of the target for the purpose of solving a problem of the generation of particles during vapor phase film formation due to a reduction in the sintered density of the target used for film formation according to the vapor phase growth method depending on the kind of doping donor ions or acceptor ions and a problem of breaking of a large target which is likely to occur during film formation, is disclosed in JP2003-63860A.

However, in JP2003-63860A, evaluation of only leakage current characteristics due to the addition of Mn is performed using a Mn-doped strontium titanate sintered body target produced by adding Si as the sintering aid in an amount of from 0.1 mol % to less than 5 mol %, and there is neither description nor suggestion regarding the effect on a PZT-based perovskite oxide film, and furthermore, the effect of improving piezoelectric properties. Moreover, since the sintering aid is contained in the thin film obtained by using the sintered body target of JP2003-63860A in an amount of from 0.1 mol % to less than 5 mol %, it is thought that the piezoelectric properties are deteriorated due to the presence of the sintering aid and the effect of the addition of donor ions cannot be sufficiently exhibited.

An attempt to dope PZT with Nb at a high concentration without the use of a sintering aid has been reported by the inventors. In JP5367242B, a Nb-doped PZT film in which the effect of the addition of donor ions is significantly exhibited by controlling film formation conditions in a non-thermal-equilibrium process is described. In JP5367242B, the production of the Nb-doped PZT film having a MPB composition succeeded.

SUMMARY OF THE INVENTION

In the method of JP5367242B, the improvement in piezoelectric properties is realized by producing a ferroelectric film primarily containing a perovskite oxide which is doped with 10 mol % to 25 mol % of donor ions and does not contain a sintering aid and acceptor ions. However, when the Nb doping amount is increased to further improve the piezoelectric properties, there is a possibility that a pyrochlore phase which does not have piezoelectric properties may be easily formed.

The present invention has been made taking the foregoing circumstances into consideration, and an object thereof is to provide a Nb-doped PZT-based piezoelectric film which has high piezoelectric properties, a piezoelectric element using the piezoelectric film, and a liquid discharge apparatus.

A piezoelectric film of the present invention is a piezoelectric film formed by a vapor phase growth method, the piezoelectric film containing:

a perovskite oxide in which a perovskite oxide represented by the following formula P is doped with Si in an amount of from 0.2 mol % to less than 0.5 mol %, wherein a ratio of a peak intensity of a pyrochlore phase to a sum of peak intensities in respective plane orientations of (100), (001), (110), (101) and (111) of a perovskite phase measured by an X-ray diffraction method (hereinafter, referred to as "the sum of X-ray diffraction peak intensities of the perovskite phase") is 0.25 or less:

$$A_{1+\delta}[(Zr_xTi_{1-x})_{1-a}Nb_a]O_y \quad \text{Formula } P$$

wherein, in formula P, A is an A-site element primarily containing Pb; Zr, Ti, and Nb are B-site elements; x is more than 0 but less than 1; a is 0.1 or more but less than 0.3; and δ=0 and y=3 are standard, provided that these values may deviate from standard values in a range in which a perovskite structure is capable of being obtained.

In this specification, "A is an A-site element primarily containing Pb" means that a component in a proportion of 90 mol % or more in the A-site element A is Pb.

In this specification, the "peak intensity" represents the maximum value of the intensity of a peak.

In the piezoelectric film of the present invention, it is preferable that a peak position of perovskite (200) measured by a 2 θ/θ measurement of an X-ray diffraction method is shifted to a higher angle side compared to a corresponding peak position of a piezoelectric film including a perovskite oxide which is not doped with Si and is represented by formula P. In addition, it is preferable that a shift amount of the peak position is more than 0° but 0.5° or less.

It is preferable that the piezoelectric film of the present invention is a columnar crystal film consisting of a number of columnar crystals.

The piezoelectric film of the present invention has a film thickness of 1 μm or greater.

A piezoelectric element of the present invention contains the piezoelectric film of the present invention and an electrode which applies an electric field to the piezoelectric film.

A liquid discharge apparatus of the present invention contains the piezoelectric element of the present invention, and a liquid discharge member which is provided integrally with, or separately from, the piezoelectric element, in which the liquid discharge member has a liquid storage chamber which stores a liquid, and a liquid discharge port through which the liquid is discharged from the liquid storage chamber to an exterior.

The piezoelectric film of the present invention is a Nb and Si co-doped PZT-based piezoelectric film formed by the vapor phase growth method, in which Nb is contained in an amount of from 10 mol % to less than 30 mol % and Si is contained as a co-doping element with Nb in an amount of from 0.2 mol % to less than 0.5 mol % in B-site, and the ratio of the peak intensity of the pyrochlore phase to the sum of X-ray diffraction peak intensities of the perovskite phase, which are measured by the X-ray diffraction method, is 0.25 or less. In this configuration, piezoelectric properties can be improved compared to a Nb-doped PZT-based piezoelectric film which is not doped with Si.

DESCRIPTION OF THE PREFERRED EMBODIMENTS

As described in "Description of the Related Art", it is known that in a piezoelectric film having a morphotropic phase boundary (MPB) composition in which Zr:Ti is near 52:48 (0.51≤Zr/(Zr+Ti)≤0.53) in a PZT-based perovskite oxide, the piezoelectric constant and the electromechanical coupling coefficient thereof become maximum, which is appropriate for actuator applications. In JP5367242B, it is described that a piezoelectric film with high characteristics in which a piezoelectric constant $d_{31}$ measured by a cantilever is 250 pm/V in a Nb-doped PZT film having such a composition is obtained.

The inventors have conducted extensive studies on an element for co-doping PZT with Nb to achieve a further increase in characteristics. As a result, by selecting Si as the co-doping element with Nb, and setting the Si doping amount to from 0.2 mol % to less than 0.5 mol % in the range of the Nb doping amount in which a pyrochlore phase is less likely to be formed by the addition of Nb, piezoelectric properties are improved compared to a film which has the same Zr/Ti ratio and Nb molar concentration in the film and is not doped with Si. Furthermore, a Nb and Si co-doped PZT-based perovskite oxide can realize a film thickness of more than 1 μm (see examples described later).

As described in the section of Description of the Related Art, a Nb-doped PZT film to which Si is added is known, and in any literature, Si is added as a sintering aid in order to lower the crystallization temperature or improve the film density. In JP3791614B, it is described that the doping concentration of Si is 0.5 mol % or more of the total, and the pyrochlore phase increases when the concentration thereof is less than 0.5 mol %.

In JP2003-63860A, as described above, there is neither description nor suggestion regarding the effect of the addition of Si on piezoelectric properties, and furthermore, the effect of the addition of Si to PZT on piezoelectric properties. As described in the section of Description of the Related Art, it is thought that the addition of Si as a sintering aid to a PZT-based perovskite oxide results in the deterioration of piezoelectric properties and thus the effect of the addition of donor ions cannot be sufficiently exhibited. Furthermore, it is common general technical knowledge that as the amount of Si increases, cracks are likely to occur due to the relationship with stress, and only a thin film having a film thickness of 1 μm or less can be formed.

The fact found by the inventors that by setting the Si doping amount to from 0.2 mol % to less than 0.5 mol % in the Nb-doped PZT-based perovskite oxide film, piezoelectric properties are improved compared to a film which has the same Zr/Ti ratio and Nb molar concentration in the film and is not doped with Si overturns the fact that a pyrochlore phase increases when the concentration of added Si is less than 0.5 mol %, and furthermore, the common general technical knowledge that the effect of the addition of donor ions cannot be sufficiently exhibited when Si is added, and enables the film thickness to be a film thickness of 1 μm or greater. Accordingly, a possibility for the further improvement in the piezoelectric properties of a PZT-based piezoelectric film was found.

That is, a piezoelectric film of the present invention is a piezoelectric film formed by a vapor phase growth method, the piezoelectric film including a perovskite oxide which is obtained by doping a perovskite oxide represented by the following formula P with Si in an amount of from 0.2 mol % to less than 0.5 mol %, in which the ratio of the peak intensity of a pyrochlore phase to the sum of peak intensities in the respective plane orientations of (100), (001), (110), (101) and (111) of a perovskite phase measured by an X-ray diffraction method (hereinafter, referred to as "the sum of X-ray diffraction peak intensities of the perovskite phase") is 0.25 or less.

$$A_{1+\delta}[(Zr_xTi_{1-x})_{1-a}Nb_a]O_y \qquad \text{Formula } P$$

In formula P, A is an A-site element primarily containing Pb; Zr, Ti, and Nb are B-site elements; x is more than 0 but less than 1; a is 0.1 or more but less than 0.3; and δ=0 and y=3 are standard, provided that these values may deviate from standard values in a range in which a perovskite structure is capable of being obtained.

A vapor phase growth method is a method to perform film formation by causing atoms having an energy of an order of magnitude as high as 1 eV to 100 eV emitted from a target or a raw material source to deposit on a substrate. In a case of a PZT-based perovskite oxide film, dopant atoms such as Si and Nb have high energy and adhere to a film formation substrate or a formed film. Therefore, it is thought that the dopant atoms are more easily incorporated into a PZT perovskite crystal lattice compared to film formation under conditions, which are not in a high-energy environment, such as the sol-gel method.

Figure 1:
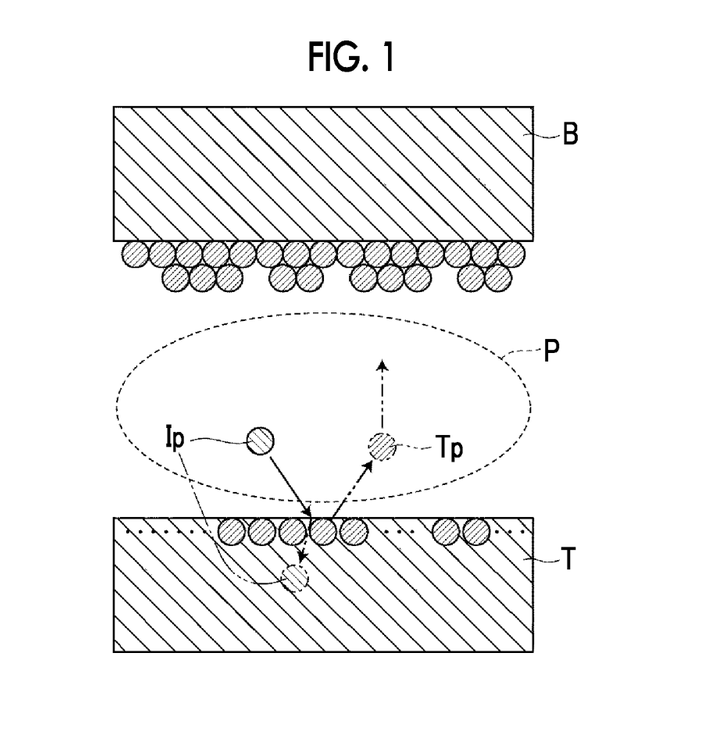
FIG. 1 is a view schematically illustrating a form during sputtering film formation.

FIG. 1 is a view schematically illustrating a form during film formation using a sputtering method. As illustrated in FIG. 1, a film formation gas is turned into plasma by plasma electrode discharge in a sputtering apparatus such that a plasma space P is generated. In the plasma space P, positive ions Ip of the film formation gas are generated, and the positive ions Ip sputter a target T. Constituent elements Tp of the target T sputtered by the positive ions Ip are emitted from the target T and form a film on a substrate B in a neutral or ionized high-energy state. This film formation is performed for a predetermined time, thereby forming a sputtered film having a predetermined thickness.

In the case of the vapor phase growth method, since the film formation can be performed by the atoms having high energy, the film formation method of the vapor phase growth method is not particularly limited, and a sputtering method, a plasma chemical vapor phase growth method (plasma CVD method), a metalorganic chemical vapor phase growth method (MOCVD method) are preferably exemplified.

Among the vapor phase growth methods, the sputtering method is preferable because the perovskite oxide film which is formed becomes a film having a columnar crystal film structure consisting of a number of columnar crystals extending in nonparallel to the substrate surface. The growth direction of the columnar crystals may be nonparallel to the substrate surface and may be either a substantially perpendicular direction or an inclined direction. In this film structure, since an oriented film with aligned crystal orientations is obtained, higher piezoelectric performance can be obtained.

The average column diameter of a number of columnar crystals constituting the piezoelectric film is not particularly limited, and is preferably 30 nm or greater and 1 μm or lower. By causing the average column diameter of the columnar crystals to be in this range, favorable crystal growth can be achieved, and a piezoelectric film which can be patterned with high accuracy can be obtained. The average column diameter of the columnar crystals mentioned here means the average value of the column diameters of all the columnar crystals in a horizontal direction at any position in a film thickness direction.

In formula P, the x value representing the ratio between Zr and Ti is not particularly limited as long as both the elements are included. Regardless of the value of x, the effect of improving the piezoelectric properties of the present invention can be obtained. However, for higher piezoelectric properties to be achieved, an MPB composition (Zr:Ti is 52:48) is preferable.

Figure 5:
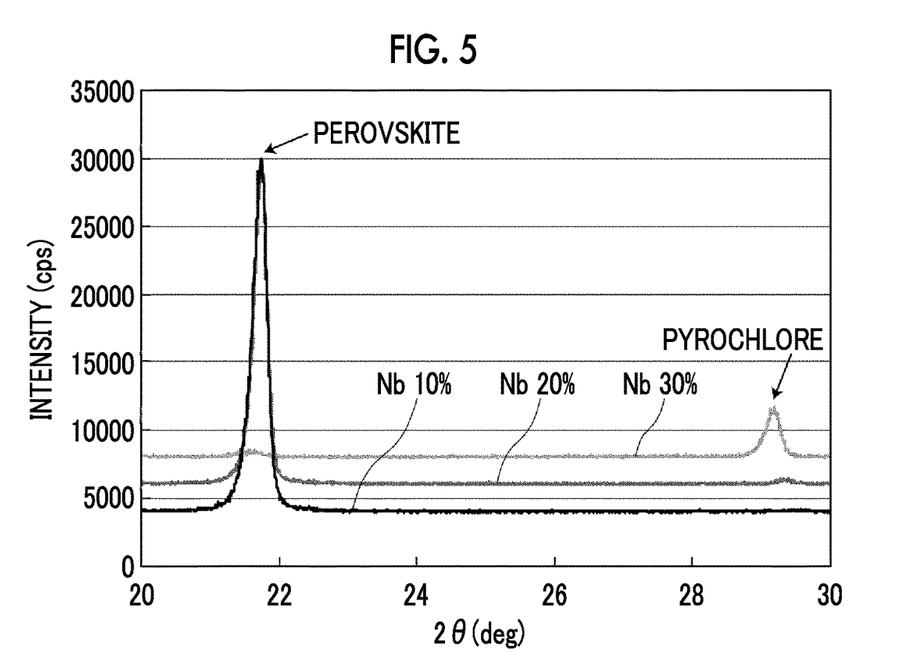
FIG. 5 is a view showing the difference between X-ray diffraction (XRD) spectra due to the concentration of Nb doping a Nb-doped PZT film.

In addition, in formula P, a representing the Nb content is 0.1 or more but less than 0.3. FIG. 5 shows XRD spectra near the perovskite (200) peak when the concentration of Nb doping the PZT film is changed. As shown in the figure, when Nb reaches 0.3, a slight pyrochlore phase peak is observed. Therefore, the Nb doping amount is set to be in a range in which the effect of improving the piezoelectric properties by Nb doping can be favorably obtained, that is, in a range in which the ratio of the peak intensity of the pyrochlore phase to the sum of X-ray diffraction peak intensities of the perovskite phase with good crystallinity, which are measured by an X-ray diffraction method, is 0.25 or less.

In addition, δ is typically 0 as described above. However, since Pb is an element that is likely to be reversely sputtered and an escape of Pb from the formed piezoelectric film has an adverse effect on crystal growth, film formation is performed by setting the amount of Pb in the target to be greater than the stoichiometric composition of PZT. In this case, depending on the reverse sputtering rate of Pb, the formed film may become rich in Pb. As long as there is no hindrance to characteristics, there is no problem even when Pb deficiency exists. However, by satisfying a range of 0≤δ≤0.2, a perovskite oxide film with good quality and no Pb deficiency can be formed. Compositional analysis was performed on a Nb-doped PZT film obtained in examples described later through X-ray fluorescence (XRF), and a range of 0≤δ≤0.2 was confirmed.

Figure 6:
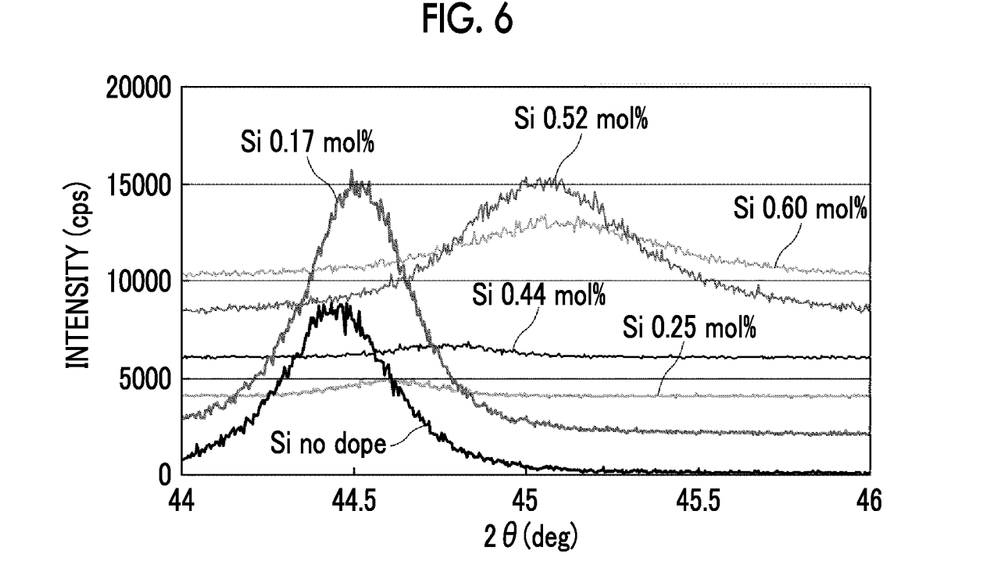
FIG. 6 is a view showing the relationship between a Si doping amount and a peak shift amount of perovskite (200) in the XRD spectra of a Nb and Si co-doped PZT film and the Nb-doped PZT film.

FIG. 6 is a graph showing the relationship between the Si doping amount and the perovskite (200) peak shift amount in the XRD spectra of a Nb and Si co-doped PZT film and a Nb-doped PZT film. As shown in FIG. 6, it was confirmed that the peak position of perovskite (200) is shifted to the higher angle side by Si doping (see examples and comparative examples described later). The shift amount of the peak position is preferably more than 0° and 0.5° or less. In FIG. 6, it is shown that when the Si doping amount is 0.25 mol % to 0.44 mol %, the shift amount of the peak position becomes 0.1° to 0.5° or less.

In addition, it is confirmed that since atoms are adhered to form a film with high energy, when the amount of Si too large, distortion occurs in crystals and results in peeling of the film. According to the investigation by the inventors, a Si doping amount of 0.88 mol % or more causes peeling of a film.

Figure 7:
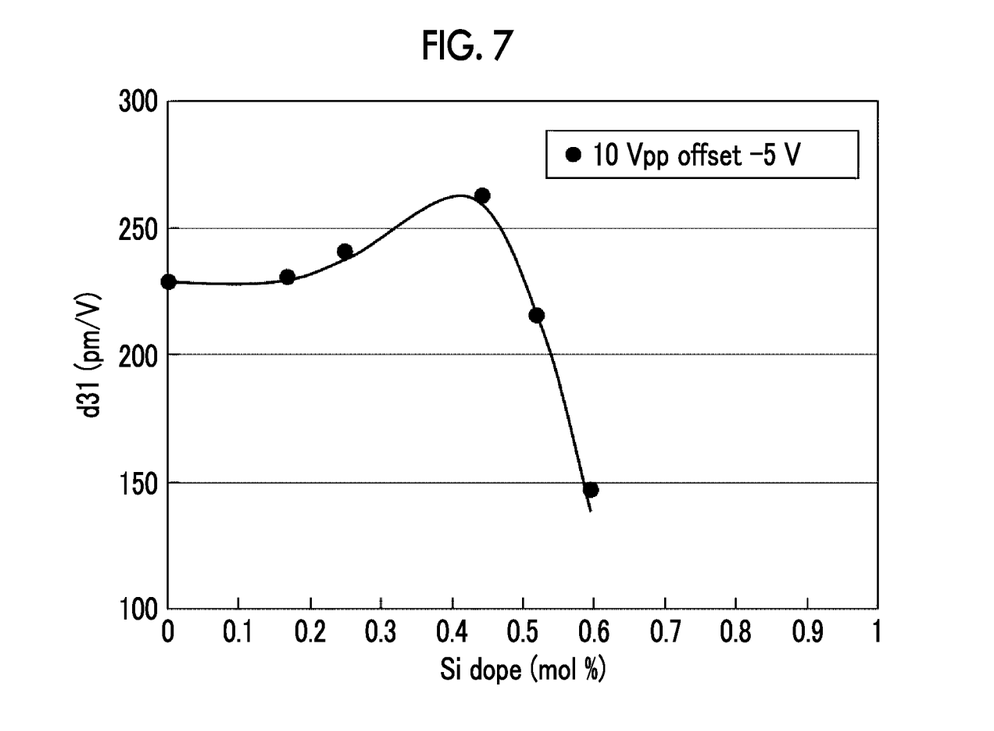
FIG. 7 is a view showing the relationship between the $d_{31}$ constant value of the Nb and Si co-doped PZT film and the Si doping amount (at an application voltage of 10 $V_{pp}$ and an offset of −5 V).
Figure 8:
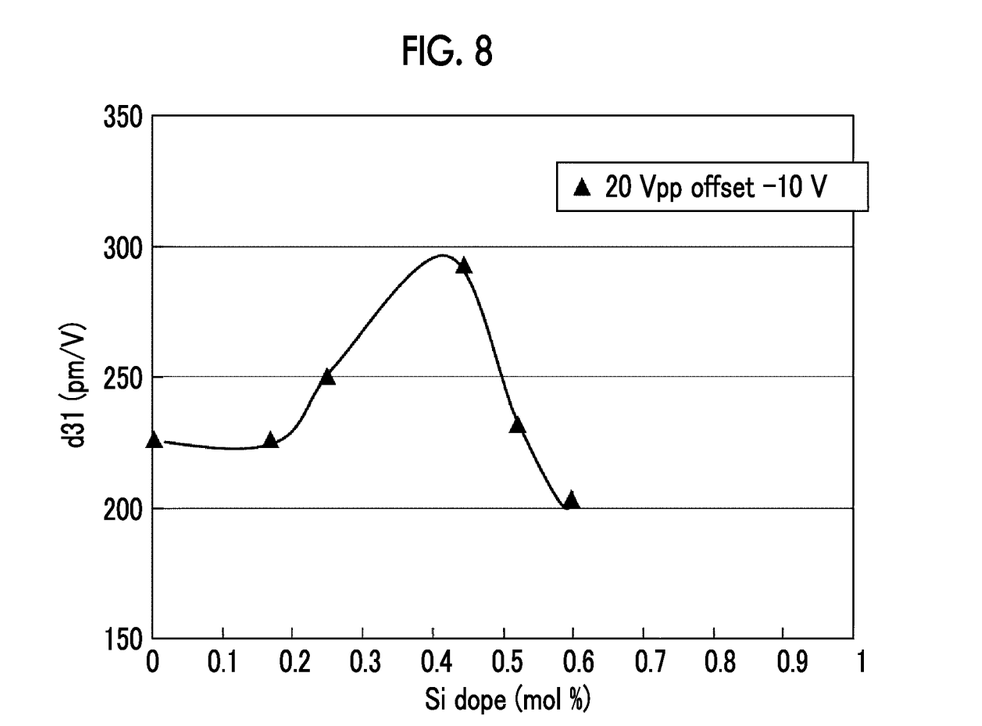
FIG. 8 is a view showing the relationship between the $d_{31}$ constant value of the Nb and Si co-doped PZT film and the Si doping amount (at an application voltage of 20 $V_{pp}$ and an offset of −10 V).

FIGS. 7 and 8 of the examples described later are diagrams showing the relationship between the $d_{31}$ constant value of the Nb and Si co-doped PZT film and the Si doping amount, where FIG. 7 shows measurement results at an application voltage of 10 $V_{pp}$ and an offset of −5 V, and FIG. 8 shows measurement results at an application voltage of 20 $V_{pp}$ and an offset of −10 V.

In both FIGS. 7 and 8, compared to the $d_{31}$ constant in the case of not doped with Si (horizontal axis 0), the $d_{31}$ constant starts to increase from near a Si doping amount of 0.2 mol %, becomes the local maximum at a concentration between 0.4 mol % and 0.5 mol %, shows a higher value than the $d_{31}$ constant value in the case of not doped with Si until about 0.5 mol % is reached, and thereafter decreases relatively sharply.

Furthermore, in comparison between FIGS. 7 and 8, it is confirmed that the d31 constant value differs between FIGS. 7 and 8 and FIG. 8 with a higher application voltage shows higher piezoelectric properties. This suggests that relaxor type electrical properties are achieved by Si doping.

A production method of the piezoelectric film of the present invention is not particularly limited as long as film formation is performed by the vapor phase growth method. However, regarding the temperature Ts of the substrate during the film formation according to the vapor phase growth method, when the substrate temperature Ts is 400° C. or lower, perovskite crystal growth becomes difficult, and when the substrate temperature Ts is 750° C. or higher, a high temperature pyrochlore phase is likely to be incorporated. In order to obtain a columnar crystal film structure with good quality, Ts preferably satisfies 450≤Ts (° C.)≤650.

In a case of a vapor phase growth method using plasma such as a sputtering method, in the range of the substrate temperature Ts, film formation is preferably performed under film formation conditions in which Vs−Vf(V) which is the difference between a plasma potential Vs (V) in plasma during the film formation and a floating potential Vf (V) satisfies the following formulas (1) and (2).

$$-0.2\ Ts+100<Vs-Vf(V)<-0.2\ Ts+130 \quad (1)$$

$$10 \leq Vs-Vf(V) \leq 35 \quad (2)$$

The piezoelectric film of the present invention is a Nb and Si co-doped PZT-based piezoelectric film formed by the vapor phase growth method, in which Nb is contained in an amount of 10 mol % or more to less than 30 mol % and Si is contained as a co-doping element with Nb in an amount of from 0.2 mol % to less than 0.5 mol % in B-site, and the ratio of the peak intensity of the pyrochlore phase to the sum of X-ray diffraction peak intensities of the perovskite phase, which are measured by the X-ray diffraction method, is 0.25 or less. In this configuration, piezoelectric properties can be improved compared to a Nb-doped PZT-based piezoelectric film which is not doped with Si.

"Piezoelectric Element and Ink Jet Recording Head"

Figure 2:
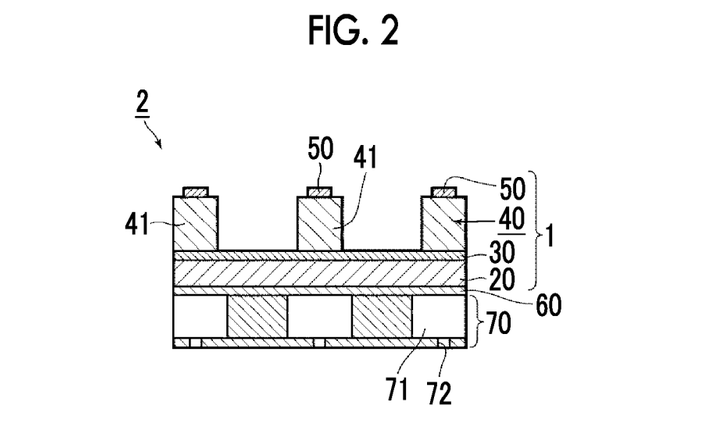
FIG. 2 is a sectional view of the structures of a piezoelectric element and an ink jet recording head (liquid discharge apparatus) of an embodiment according to the present invention.

The structures of a piezoelectric element of the embodiment according to the present invention, and an ink jet recording head (liquid discharge apparatus) including the same will be described with reference to FIG. 2. FIG. 2 is a sectional view of main parts of the ink jet recording head. For ease of viewing, the scales of the constituent elements are appropriately changed from actual scales.

A piezoelectric element (ferroelectric element) 1 of the embodiment is an element in which a lower electrode 30, a piezoelectric film 40, and an upper electrode 50 are sequentially laminated on a substrate 20, and an electric field is applied to the piezoelectric film 40 by the lower electrode 30 and the upper electrode 50 in the thickness direction. The piezoelectric film 40 is the piezoelectric film of the present invention.

The lower electrode 30 is formed on substantially the entire surface of the substrate 20, the piezoelectric film 40 having a pattern in which line-shaped protruding portions 41 extending from the front side to the rear side in the figure are arranged in a stripe shape is formed thereon, and the upper electrode 50 is formed on each of the protruding portions 41.

The pattern of the piezoelectric film 40 is not limited to the illustrated pattern and is appropriately designed. In addition, the piezoelectric film 40 may also be a continuous film. However, by forming the piezoelectric film 40 in the pattern consisting of the plurality of protruding portions 41 which are separated from each other instead of a continuous film, extension and contraction of the individual protruding portions 41 smoothly occur, and a greater displacement amount is obtained, which is preferable.

The substrate 20 is not particularly limited, and a substrate made of silicon, glass, stainless steel (SUS), yttrium-stabilized zirconia (YSZ), alumina, sapphire, or silicon carbide may be employed. As the substrate 20, a laminated substrate such as a SOI substrate in which a $SiO_2$ oxide film is formed on the surface of a silicon substrate may be used.

The primary components of the lower electrode 30 are not particularly limited, and metals or metal oxides such as Au, Pt, Ir, $IrO_2$, $RuO_2$, $LaNiO_3$, and $SrRuO_3$ and combinations thereof may be employed.

The primary components of the upper electrode 50 are not particularly limited, and the materials that exemplify the lower electrode 30, electrode materials generally used in a semiconductor process, such as Al, Ta, Cr, and Cu, and combinations thereof may be employed.

The thicknesses of the lower electrode 30 and the upper electrode 50 are not particularly limited, and for example, may be about 200 nm. The film thickness of the piezoelectric film 40 is not particularly limited, is typically 1 μm or greater, and is for example, 1 μm to 5 μm. The film thickness of the piezoelectric film 40 is preferably 3 μm or greater.

In the ink jet recording head (liquid discharge apparatus) 2, an ink nozzle (liquid storage and discharge member) 70 having ink chambers (liquid storage chambers) 71 that store ink and ink discharge ports (liquid discharge ports) 72 through which the ink is discharged from the ink chamber 71 to the exterior is attached to substantially the lower surface of the substrate 20 of the piezoelectric element 1 having the above-described configuration via a diaphragm 60. A plurality of the ink chambers 71 are provided to correspond to the number and pattern of the protruding portions 41 of the piezoelectric film 40.

In the ink jet recording head 2, the intensity of an electric field applied to the protruding portions 41 of the piezoelectric element 1 is varied with the protruding portions 41 so as to cause the protruding portions 41 to extend and contract, such that the discharge and discharge amount of ink from the ink chambers 71 are controlled.

Instead of attaching the diaphragm 60 and the ink nozzle 70 which are members independent from the substrate 20, a portion of the substrate 20 may be processed into the diaphragm 60 and the ink nozzle 70. For example, in a case where the substrate 20 is formed as a laminated substrate such as a SOI substrate, the diaphragm 60 and the ink nozzle 70 may be formed by etching the rear surface side of the substrate 20 to form the ink chamber 71 and processing the substrate itself.

The piezoelectric element 1 and the ink jet recording head 2 of the embodiment are configured as described above.

"Ink Jet Recording Device"

Figure 3:
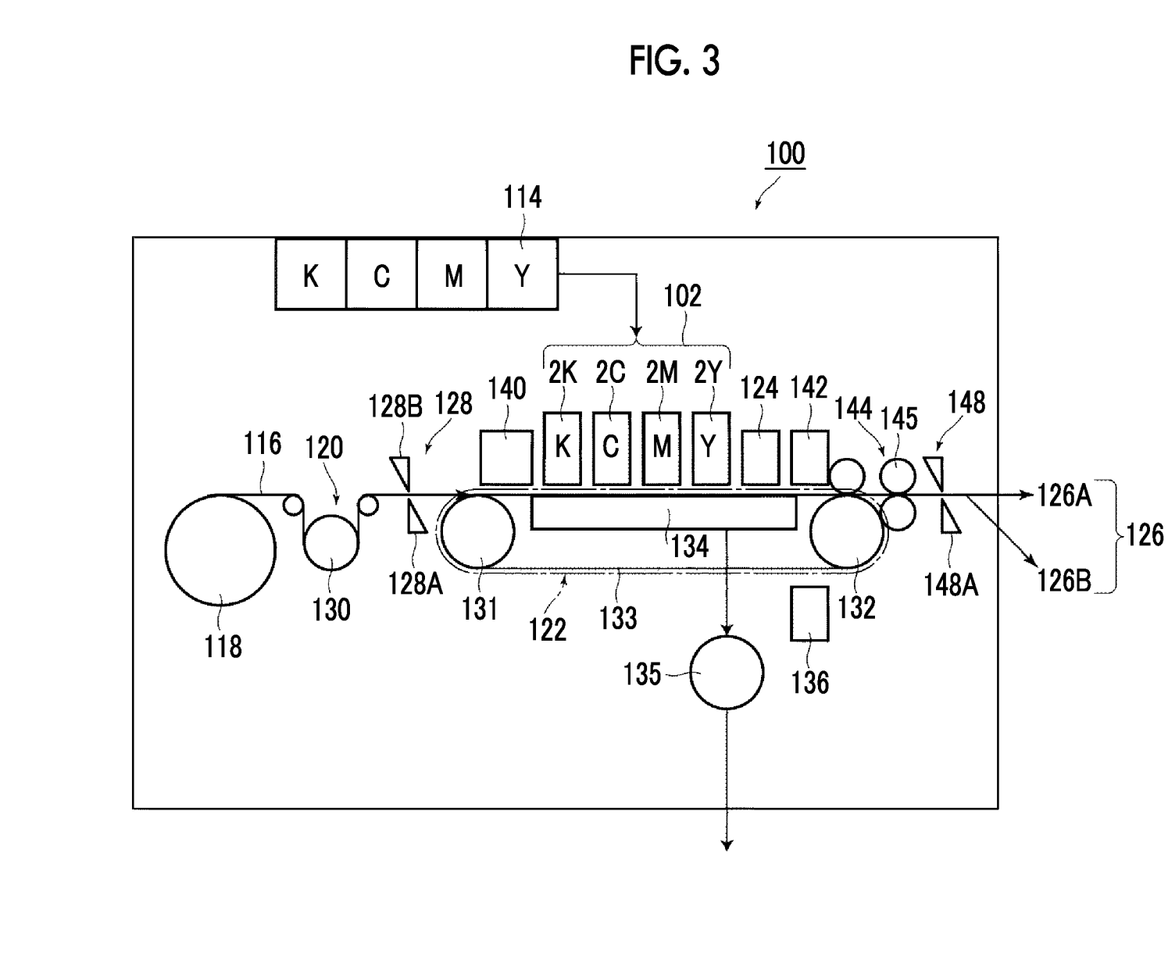
FIG. 3 is a view illustrating an example of the configuration of an ink jet recording device provided with the ink jet recording head of FIG. 2.
Figure 4:
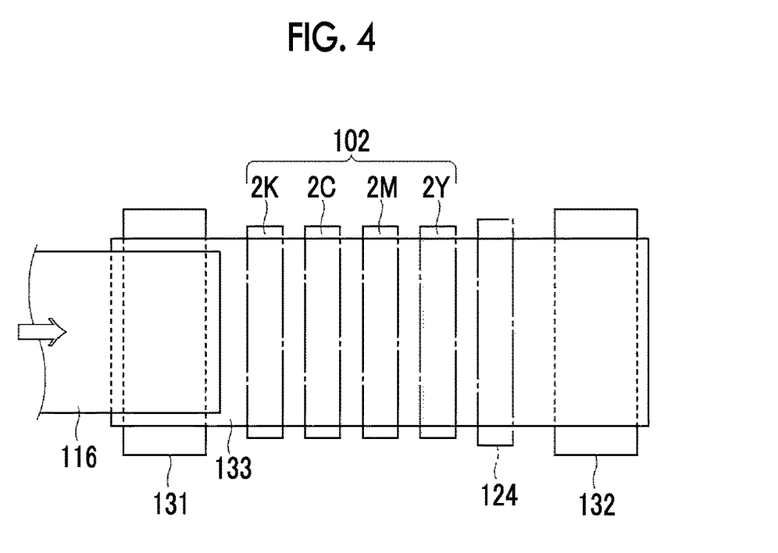
FIG. 4 is a partial top view of the ink jet recording device of FIG. 3.

An example of the configuration of an ink jet recording device provided with the ink jet recording head 2 of the embodiment will be described with reference to FIGS. 3 and 4. FIG. 3 is an overall view of the device, and FIG. 4 is a partial top view.

An ink jet recording device 100 which is illustrated is schematically constituted by a printing unit 102 having a plurality of ink jet recording heads (hereinafter, simply referred to as "heads") 2K, 2C, 2M, and 2Y respectively provided for ink colors, an ink storage/loading unit 114 which stores ink supplied to the heads 2K, 2C, 2M, and 2Y, a sheet feeding unit 118 which feds a recording sheet 116, a decurling unit 120 which eliminates curl of the recording sheet 116, an adsorption belt transporting unit 122 which is disposed to face a nozzle surface (ink discharge surface) of the printing unit 102 and transports the recording sheet 116 while holding the flatness of the recording sheet 116, a printing detection unit 124 which reads printing results of the printing unit 102, and a discharge unit 126 which discharges the printed recording sheet (printed matter) to the exterior.

Each of the heads 2K, 2C, 2M, and 2Y constituting the printing unit 102 is the ink jet recording head 2 of the embodiment.

In the decurling unit 120, heat is applied to the recording sheet 116 by a heating drum 130 in a direction opposite to the curl direction, such that decurling is performed.

In an apparatus which uses a rolled sheet, as in FIG. 3, a cutter 128 for cutting is provided at the rear stage of the decurling unit 120, and the rolled sheet is cut into a desired size by the cutter. The cutter 128 is constituted by a fixed blade 128A having a length of equal to or greater than the transporting path width of the recording sheet 116, a round blade 128B which is moved along the fixed blade 128A, the fixed blade 128A is provided on the printing back surface side, and the round blade 128B is disposed on the printed surface side with the transporting path interposed therebetween. In an apparatus which uses a cut sheet, the cutter 128 is unnecessary.

The recording sheet 116 which is decurled and cut is sent to the adsorption belt transporting unit 122. The adsorption belt transporting unit 122 has a structure in which an endless belt 133 is wound between rollers 131 and 132 and is configured so that at least a portion which faces the nozzle surface of the printing unit 102 and a sensor surface of the printing detection unit 124 is a horizontal surface (flat surface).

The belt 133 has a width dimension wider than the width of the recording sheet 116, and a number of suction holes (not illustrated) are formed on the belt surface. On the inside of the belt 133 suspended between the rollers 131 and 132, at a position at which the belt 133 faces the nozzle surface of the printing unit 102 and the sensor surface of the printing detection unit 124, an adsorption chamber 134 is provided. By suctioning the adsorption chamber 134 using a fan 135 to achieve a negative pressure, the recording sheet 116 on the belt 133 is adsorbed and held.

As power of a motor (not illustrated) of at least one of the rollers 131 and 132 around which the belt 133 is wound is transmitted, the belt 133 is driven in a clockwise direction in FIG. 3, and the recording sheet 116 held on the belt 133 is transported from the left to the right in FIG. 3.

When borderless printing is performed, ink is adhered onto the belt 133. Therefore, a belt cleaning unit 136 is provided at a predetermined position (an appropriate position excluding the printing region) on the exterior of the belt 133.

On the upstream side of the printing unit 102 on the sheet transporting path formed by the adsorption belt transporting unit 122, a heating fan 140 is provided. The heating fan 140 heats the recording sheet 116 by blowing heating air toward the recording sheet 116 before being printed. Since the recording sheet 116 is heated immediately before printing, ink can be easily dried after being adhered.

The printing unit 102 is a so-called full line type head in which line type heads having a length corresponding to the maximum sheet width is disposed in a direction perpendicular to the sheet feeding direction (main scanning direction) (see FIG. 4). Each of the printing heads 2K, 2C, 2M, and 2Y is configured as a line type head in which a plurality of ink discharge ports (nozzles) are arranged to have a length greater than at least one side of the recording sheet 116 with the maximum size, which is an object of the ink jet recording device 100.

The heads 2K, 2C, 2M, and 2Y respectively corresponding to color inks are disposed in order of black (K), cyan (C), magenta (M), and yellow (Y) from the upstream side in the feeding direction of the recording sheet 116. By discharging color ink from each of the heads 2K, 2C, 2M, and 2Y while transporting the recording sheet 116, a color image is recorded on the recording sheet 116.

The printing detection unit 124 is formed as a line sensor or the like which images droplet ejection results of the printing unit 102 and detects discharge failure such as clogging of a nozzle from an image of the ejected droplets, which is read by the line sensor.

At the rear stage of the printing detection unit 124, a post-drying unit 142 which is formed as a heating fan or the like, which dries the printed image surface. Since it is preferable to avoid contact with the printed surface until the ink is dried after the printing, a heated air blowing method is preferable.

At the rear stage of the post-drying unit 142, a heating and pressurizing unit 144 is provided to control the glossiness of the image surface. In the heating and pressing unit 144, the image surface is pressed by a pressing roller 145 having predetermined surface uneven shapes while the image surface is heated, such that the uneven shapes are transferred onto the image surface.

The printed matter obtained in this manner is discharged from the discharge unit 126. It is preferable that a target image to be originally printed (a print of a target image) and a test print are separately discharged. In the ink jet recording device 100, sorting means (not illustrated) for switching between sheet discharge paths to sorting the printed matter of the original image and the printed matter of the test print to be respectively sent to discharge units 126A and 126B is provided.

In a case where the original image and the test print are simultaneously printed in parallel on a large sheet, a configuration in which a cutter 148 is provided to cut and separate a portion of the test print may be employed.

The ink jet recording device 100 is configured as described above.

(Design Change)

The present invention is not limited to the above-described embodiment, and various changes in design can be made without departing from the gist of the present invention.

EXAMPLES

Examples according to the present invention will be described.

(Example 1)

As a film formation substrate, a substrate with an electrode, in which a 10 nm-thick Ti adhesion layer and a 300 nm-thick Ir lower electrode were sequentially laminated on a 25 mm square silicon on insulator (SOI) substrate, was prepared. In the substrate, for evaluation of a piezoelectric constant, a region capable of being evaluated by a cantilever was provided in advance.

The substrate with an electrode was placed in an RF sputtering apparatus, and under conditions with a degree of vacuum of 0.3 Pa and an Ar/O$_2$ mixed atmosphere (O$_2$ volume fraction 2.0%), by using targets in which the value of Zr/(Zr+Ti) in the target was set to 0.52 and the amount of Nb doping B-site was set to 10%, 20%, and 30%, setting a substrate temperature to 450° C., and setting a power density D on the target to be in a range of 3.0 D(W/cm$^2$)≤6.0, film formation of a Nb-doped PZT piezoelectric films with a thickness of 3.0 μm was performed. As the target, a single target was used.

Results of XRD measurement performed on each Nb-doped PZT film which was formed are shown in Table 5. As shown in FIG. 5, it was confirmed that Nb-doped PZT films in which the amount of Nb doping the B-site were 10 mol % and 20 mol % were (100)-oriented perovskite oxides with no pyrochlore phase and good quality. A slight pyrochlore phase was conformed in a Nb-doped PZT film in which the Nb doping amount was 30%.

Next, Nb and Si co-doped PZT targets were produced by setting Zr/(Zr+Ti) in the target to 0.52, setting the amount of Nb doping the B-site to 10 mol %, and causing the concentration of Si in the piezoelectric film after the film formation to be 0.25 (Example 1), 0.44 (Example 2), 0.17 (Comparative Example 1), 0.52 (Comparative Example 2), 0.60 (Comparative Example 3), and 0.88 (Comparative Example 4) mol %, film formation of Nb and Si co-doped PZT films was performed under the same conditions as those of the Nb-doped PZT film described above.

The film thicknesses of the Nb and Si co-doped PZT films which were formed were all 2.5 μm.

XRD measurement was performed on the Nb and Si co-doped PZT films which were formed, and it was confirmed that all the films excluding the film having a Si doping amount of 0.88 mol % were (100)-oriented perovskite oxides with no pyrochlore phase and good quality. In the having a Si doping amount of 0.88 mol %, peeling of the PZT film had occurred. It is thought that this is because crystal distortion is enlarged as the amount of Si incorporated into the crystal lattice increases and this results in the occurrence of peeling.

In the film having a Si doping amount of 0.88 mol % in which peeling of the film had occurred, the ratio of the peak intensity of pyrochlore phase to the sum of peak intensities in the respective plane orientations of (100), (001), (110), (101) and (111) of a perovskite phase measured by XRD (the ratio between pyrochlore and perovskite) was 0.28.

It is thought that films in which the ratio of the peak intensity of a pyrochlore phase to the sum of peak intensities in the respective plane orientations of (100), (001), (110), (101) and (111) of a perovskite phase measured by XRD (the ratio between pyrochlore and perovskite) is 0.25 or less are perovskite oxides with good quality.

Regarding the films of Examples 1 and 2 and Comparative Examples 1 to 3, XRD spectra near the perovskite (200) peak are shown in FIG. 6. In Examples 1 and 2 and Comparative Example 1 in which the Si doping amount was less than 0.5 mol %, it can be seen that the perovskite (200) peak was shifted to the higher angle side by a shift amount of 0.5° or less.

Compositional analysis was performed on the obtained Nb and Si co-doped PZT films through X-ray fluorescence (XRF). As a result, Pb in the film was Pb/(Zr+Ti+Nb+Si): 1.00 to 1.20. In addition, regarding the amount of Si, in order to remove the influence of signals from the Si substrate, film formation was performed on a substrate (sapphire substrate) that did not contain Si, and the Si doping amount in the Nb and Si co-doped PZT film was calculated. As a result, it was confirmed that Si was substantially 0.25 (Example 1), 0.44 (Example 2), 0.17 (Comparative Example 1), 0.52 (Comparative Example 2), 0.60 (Comparative Example 3), and 0.88 (Comparative Example 4) mol %.

<Displacement Amount Evaluation>

Regarding Examples 1 and 2 and Comparative Examples 1 to 3, a 100 nm-thick Pt upper electrode was formed on the Nb-doped PZT film, thereby producing a piezoelectric element. By processing the cantilever formation region of each of the example into a strip shape having a width of about 2 mm and a length of about 24 mm, cantilevers were produced. In addition, the longitudinal direction of the cantilever was caused to correspond to a (110) direction of Si crystals, and the thickness direction thereof was caused to correspond to a (100) direction.

After the cantilever was fixed to cause the displaceable length of the cantilever to be about 18 mm, a voltage was applied between the upper electrode and the lower electrode under the following application voltage conditions (1) and (2), and a displacement amount was obtained by measuring a tip end displacement amount when a sine wave drive voltage was applied, using a laser doppler vibrometer. Vpp refers to the potential difference between the highest value and the lowest value of an AC voltage waveform.

(1) Sine wave drive voltage at a frequency of 1 kHz, 10 Vpp, and an offset voltage −5 V (2) Sine wave drive voltage at a frequency of 1 kHz, 20 Vpp, and an offset voltage −10 V First, using a finite element method, a resonant frequency was calculated by changing the length of the cantilever, and an effective length $L_0$ was determined by matching the resonant frequency to an actual measurement value. Next, the tip end displacement amount was calculated by setting the length $L_0$, a piezoelectric constant $d_{31}$ was obtained when the tip end displacement amount was matched to an actual measurement value, and this was determined as the piezoelectric constant of a PZT-based thin film. A structure used in the finite element method was Pt (0.3 μm)·PZT/Ir (0.3 μm)/Si, the following values were used as parameter values. In addition, since Si is an anisotropic material, a Young's modulus and a Poisson's ratio used in a simulation calculation need to correspond to the orientation of the cantilever longitudinal direction.

Si (110) orientation: Young's modulus $Y_{Si}$=169 GPa, Poisson's ratio $n_{Si}$=0.064

PZT: Young's modulus $Y_{PZT}$=50 GPa, Poisson's ratio $n_{PZT}$=0.34

Ir (lower electrode): Young's modulus $Y_{Ir}$=530 GPa, Poisson's ratio $n_{Ir}$=0.26

Pt (upper electrode): Young's modulus $Yp_{Pt}$=168 GPa, Poisson's ratio $n_{Pt}$=0.39

FIGS. 7 and 8 show the relationship between the Si doping amount and the piezoelectric constant $d_{31}$ regarding the measurement results under the conditions (1) and (2), respectively. It was confirmed that the piezoelectric constant was high when the Si doping amount was in a range of from 0.2 mol % to less than 0.5 mol %. On the other hand, in a case of doping at 0.5 mol % or more, the properties deteriorate. In the case of doping at 0.2 mol % or less, the piezoelectric constant value was hardly changed from the Nb-doped PZT film which was not doped with Si.

As described above, in Examples 1 and 2 and Comparative Example 1 in which the Si doping amount was less than 0.5 mol %, the perovskite (200) peak was shifted to the higher angle side by a shift amount of 0.5° or less (FIG. 6). As described above, the peak shift amount was 0.1 to 0.5 when the Si doping amount was in a range of from 0.2 mol % to less than 0.5 mol % in which the effect of improving piezoelectric properties could be obtained.

The piezoelectric film of the present invention can be preferably used in an ink jet recording head, a magnetic recording and reproducing head, a microelectromechanical systems (MEMS) device, a micropump, a piezoelectric actuator mounted in an ultrasound probe, and a ferroelectric element such as a ferroelectric memory.

What is claimed is:

1. A piezoelectric film formed by a vapor phase growth method, the piezoelectric film comprising:
a perovskite oxide in which a perovskite oxide represented by the following formula P is doped with Si in an amount of from 0.2 mol % to less than 0.5 mol %, wherein a ratio of a peak intensity of a pyrochlore phase to a sum of peak intensities in respective plane orientations of (100), (001), (110), (101) and (111) of a perovskite phase measured by an X-ray diffraction method is 0.25 or less:

Formula P wherein, in formula P, A is an A-site element primarily containing Pb; Zr, Ti, and Nb are B-site elements; x is more than 0 but less than 1; a is 0.1 or more but less than 0.3; and δ=0 and y=3 are standard, provided that these values may deviate from standard values in a range in which a perovskite structure is obtained.

2. The piezoelectric film according to claim 1, wherein a peak position of perovskite (200) measured by a 2θ/θ measurement of an X-ray diffraction method is shifted to a higher angle side compared to a corresponding peak position of a piezoelectric film including a perovskite oxide which is not doped with Si and is represented by formula P.

3. The piezoelectric film according to claim 2, wherein a shift amount of the peak position to the higher angle side is more than 0° but 0.5° or less.

4. The piezoelectric film according to claim 1, wherein the piezoelectric film is a columnar crystal film consisting of a number of columnar crystals.

5. The piezoelectric film according to claim 1, wherein the piezoelectric film has a film thickness of 1 μm or greater.

6. A piezoelectric element, comprising:
the piezoelectric film according to claim 1; and
an electrode which applies an electric field to the piezoelectric film.

7. A liquid discharge apparatus, comprising:
the piezoelectric element according to claim 6; and
a liquid discharge member which is provided integrally with, or separately from, the piezoelectric element,
wherein the liquid discharge member has a liquid storage chamber which stores a liquid, and a liquid discharge port through which the liquid is discharged from the liquid storage chamber to an exterior.

* * * * *